United States Patent
You et al.

(10) Patent No.: US 8,649,186 B2
(45) Date of Patent: Feb. 11, 2014

(54) PACKAGE SUBSTRATE AND SEMICONDUCTOR PACKAGE HAVING THE SAME

(75) Inventors: Se-Ho You, Seoul (KR); Heeseok Lee, Yongin-si (KR); Chiyoung Lee, Hwaseong-si (KR); Yun-Hee Lee, Daejeon (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 409 days.

(21) Appl. No.: 12/903,629

(22) Filed: Oct. 13, 2010

(65) Prior Publication Data

US 2011/0141712 A1    Jun. 16, 2011

(30) Foreign Application Priority Data

Dec. 11, 2009    (KR) .................... 10-2009-0123451

(51) Int. Cl.
*H05K 1/11*    (2006.01)
*H05K 1/14*    (2006.01)

(52) U.S. Cl.
USPC ........... 361/803; 361/767; 361/790; 174/260; 174/264

(58) Field of Classification Search
USPC ............... 174/260–264; 361/760, 767, 803
See application file for complete search history.

(56) References Cited

U.S. PATENT DOCUMENTS

| 6,265,783 | B1 | 7/2001 | Juso et al. | |
| 6,512,861 | B2 * | 1/2003 | Chakravorty et al. | 385/14 |
| 2006/0090931 | A1 * | 5/2006 | Hashimoto | 174/260 |
| 2008/0253102 | A1 * | 10/2008 | Kuroda | 361/803 |

FOREIGN PATENT DOCUMENTS

| JP | 2000-216281 | 8/2000 |
| KR | 10-0199286 | 3/1999 |
| KR | 10-0809254 | 2/2008 |

\* cited by examiner

*Primary Examiner* — Tuan T Dinh
(74) *Attorney, Agent, or Firm* — Harness, Dickey & Pierce, P.L.C.

(57) ABSTRACT

A package substrate includes a main body having an upper surface and a lower surface opposite to the upper surface, a plurality of external terminals attached to the lower surface, and a plurality of grooves formed in regions of the lower surface to which the plurality of external terminals is not attached. The semiconductor package includes a package substrate, a semiconductor chip mounted on the upper surface of the semiconductor substrate, and a board providing a region mounted with the package substrate and being mounted with a plurality of mounting elements which are vertically aligned with the plurality of grooves and are inserted into the plurality of grooves.

4 Claims, 16 Drawing Sheets

PACKAGE SUBSTRATE AND SEMICONDUCTOR PACKAGE HAVING THE SAME

CROSS-REFERENCE TO RELATED APPLICATIONS

This U.S. non-provisional patent application claims priority under 35 U.S.C. §119 to Korean Patent Application 10-2009-0123451, filed on Dec. 11, 2009, the entire contents of which are hereby incorporated by reference.

BACKGROUND

1. Field

Example embodiments of the invention relate to a semiconductor, for example, to a package substrate capable of increasing an effective mounting area and a semiconductor package having the same.

2. Description of the Related Art

Various kinds of semiconductor packages have been developed for various application fields. The semiconductor package generally has a rectangular shape with a uniform thickness. In the conventional art, the width, length, and thickness of the semiconductor package are determined as form factors and then a package design is formed therein. In recent years, with a tendency towards miniaturization of a semiconductor chip, semiconductor packages used in semiconductor chips have become thin and simple.

SUMMARY

The present disclosure provides a package substrate realizing small form factors and a semiconductor package having the same.

The package substrate and the semiconductor package including the package substrate increase an effective mounting area of a board by improving a design of the package substrate.

In accordance with an example embodiment of the invention, a package substrate may include a main body having an upper surface and a lower surface opposite to the upper surface, a plurality of external terminals on the lower surface, and at least one groove in a region of the lower surface to which the plurality of external terminals is not attached.

In accordance with an example embodiment, a semiconductor package may include a board including mounting elements, a package substrate on the board and including grooves into which the mounting elements are inserted, and a semiconductor chip on the package substrate.

In accordance with example embodiments, a semiconductor package may include a package substrate including a main body having an upper surface and a lower surface opposite to the upper surface, a plurality of external terminals attached to the lower surface, and a plurality of grooves formed in regions of the lower surface to which the plurality of external terminals are not attached. The semiconductor package may also include a semiconductor chip on the upper surface of the package substrate and a board on the lower surface of the package substrate. The semiconductor package may also include a plurality of mounting elements connecting the package substrate to the board, the plurality of mounting elements being inserted into the plurality of grooves.

Example embodiments of the invention provide a package substrate including: a main body having an upper surface and a lower surface opposite to the upper surface; a plurality of external terminals attached to the lower surface; and a groove formed in a region of the lower surface to which the plurality of external terminals is not attached.

In some embodiments, the groove may be recessed toward the upper surface from the lower surface.

In other embodiments, the groove may include at least one of a first groove formed in an edge region of the lower surface and a second groove formed in a central region of the lower surface.

In still other embodiments, one of the first and second grooves may be more recessed compared to the other.

Example embodiments of the invention also provide a semiconductor package including: a board including mounting elements; a package substrate mounted on the board and including grooves into which the mounting elements are inserted; and a semiconductor chip mounted on the package substrate.

In some embodiments, a region where the mounting elements may be mounted on the board overlaps with a region where the package substrate is mounted on the board.

In other embodiments, the package substrate may include an upper surface for providing a region where the semiconductor chip is mounted and a lower surface formed with the grooves. The package substrate may further comprise external terminals arranged on the lower surface to electrically connect the package substrate to the board.

In still other embodiments, the grooves may be disposed in regions on the lower surface not arranged with the external terminal.

In even other embodiments, the grooves may be recessed toward the upper surface from a surface of the lower surface, and the recessed depths of the grooves are equal to or different from each other.

In yet other embodiments, one of the grooves and the mounting elements may be arranged in accordance with an arrangement of the other.

Example embodiments of the invention also provide a semiconductor package including: a package substrate including a main body having an upper surface and a lower surface opposite to the upper surface, a plurality of external terminals attached to the lower surface, and a plurality of grooves formed in regions to which the plurality of external terminals are not attached; a semiconductor chip mounted on the upper surface of the package substrate; and a board providing a region mounted with the package substrate and being mounted with a plurality of mounting elements which are vertically aligned with the plurality of grooves and are inserted into the plurality of grooves.

In some embodiments, the plurality of grooves may include: a plurality of first grooves formed in an edge region of the lower surface of the package substrate and having a first depth; and a plurality of second grooves formed in a central region of the lower surface of the package substrate and having a second depth.

In other embodiments, the first and second depths may be equal to each other, or one of the first and second depths may be larger compared to the other.

In still other embodiments, the plurality of external terminals may be uniformly or nonuniformly arranged on the lower surface of the package substrate. In addition, the plurality of grooves may be recessed at a certain depth in regions between the plurality of external terminals on the lower surface of the package substrate.

BRIEF DESCRIPTION OF THE DRAWINGS

The accompanying drawings are included to provide a further understanding of the inventive concepts, and are incorporated in and constitute a part of this specification. The drawings illustrate example embodiments of the invention and, together with the description, serve to explain principles of the inventive concepts. In the drawings.

DETAILED DESCRIPTION OF THE EXAMPLE EMBODIMENTS

Figure 1A:
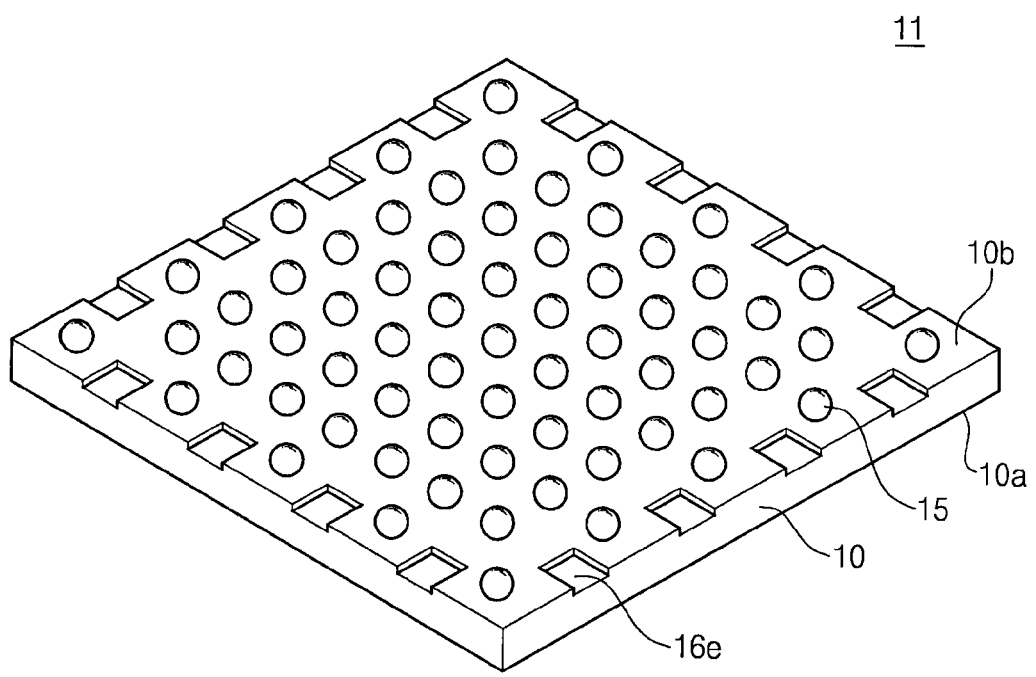
FIG. 1A is a perspective view illustrating a package substrate according to an example embodiment of the invention.

Example embodiments of the invention will be described below in more detail with reference to the accompanying drawings such that those skilled in the art could easily practice the scope of the inventive concepts. The inventive concepts may, however, be embodied in different forms and should not be construed as limited to the example embodiments set forth herein. Rather, these example embodiments are provided so that this disclosure will be thorough and complete, and will fully convey the scope of the inventive concepts to those skilled in the art.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements that may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures. The figures are intended to depict example embodiments of the invention and should not be interpreted to limit the intended scope of the claims. The accompanying figures are not to be considered as drawn to scale unless explicitly noted.

The terminology used herein is for the purpose of describing particular example embodiments only and is not intended to be limiting of the example embodiments of the invention. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof. In this specification, the term "and/or" picks out each individual item as well as all combinations of them.

Example embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Unless otherwise defined, all terms (including technical and scientific terms) used herein have the same meaning as commonly understood by one of ordinary skill in the art to which the example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the figures (FIGS.). For example, two FIGS. shown in succession may in fact be executed substantially concurrently or may sometimes be executed in the reverse order, depending upon the functionality/acts involved.

When it is determined that a detailed description related to a related known function or configuration may make the purpose of the example embodiments unnecessarily ambiguous, the detailed description thereof will be omitted. Also, terms used herein are defined to appropriately describe example embodiments and thus may be changed depending on a user, the intent of an operator, or a custom. Accordingly, the terms must be defined based on the following overall description within this specification.

Figure 1B:
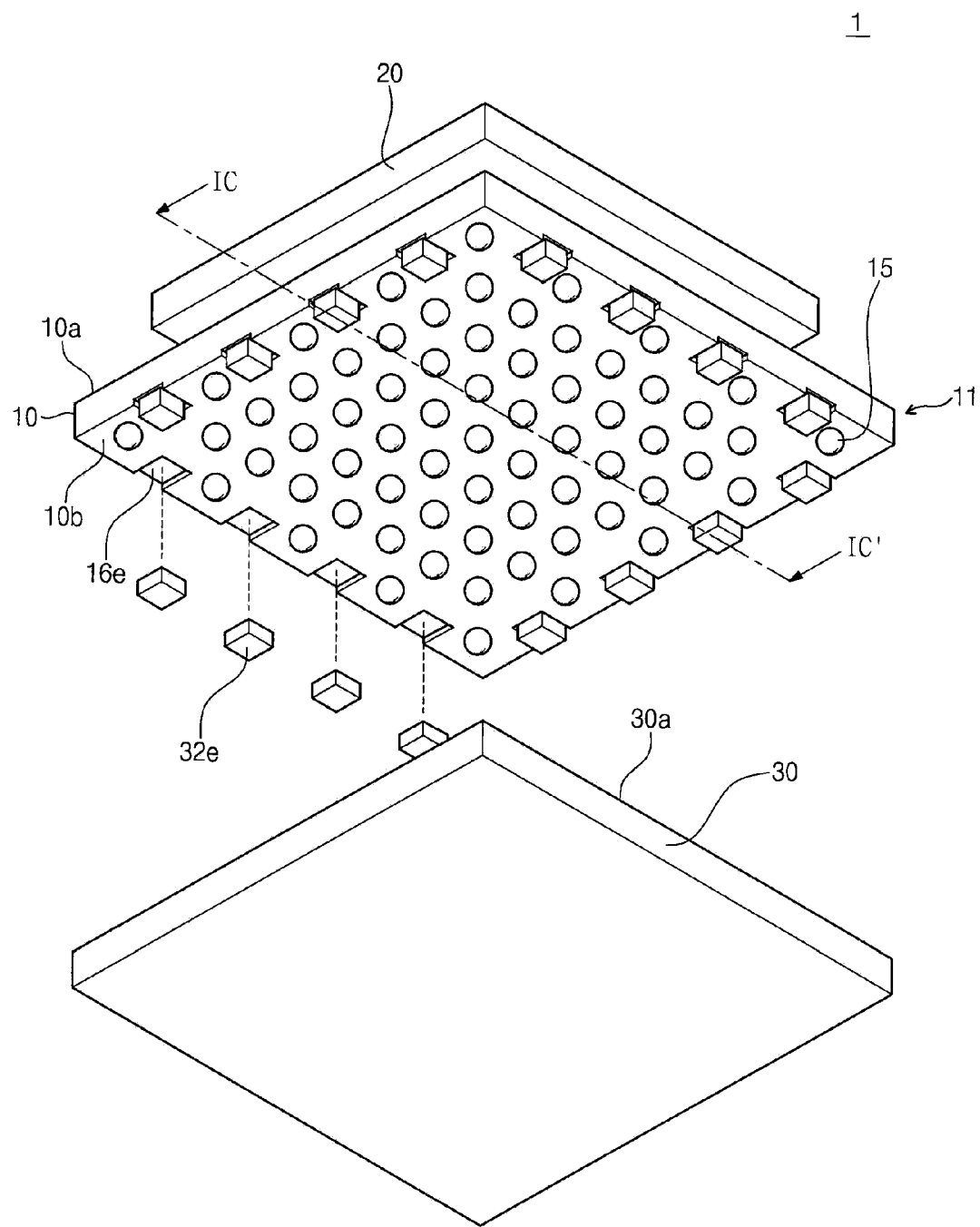
FIG. 1B is a perspective view illustrating a semiconductor package including the package substrate illustrated in FIG. 1A.
Figure 1C:
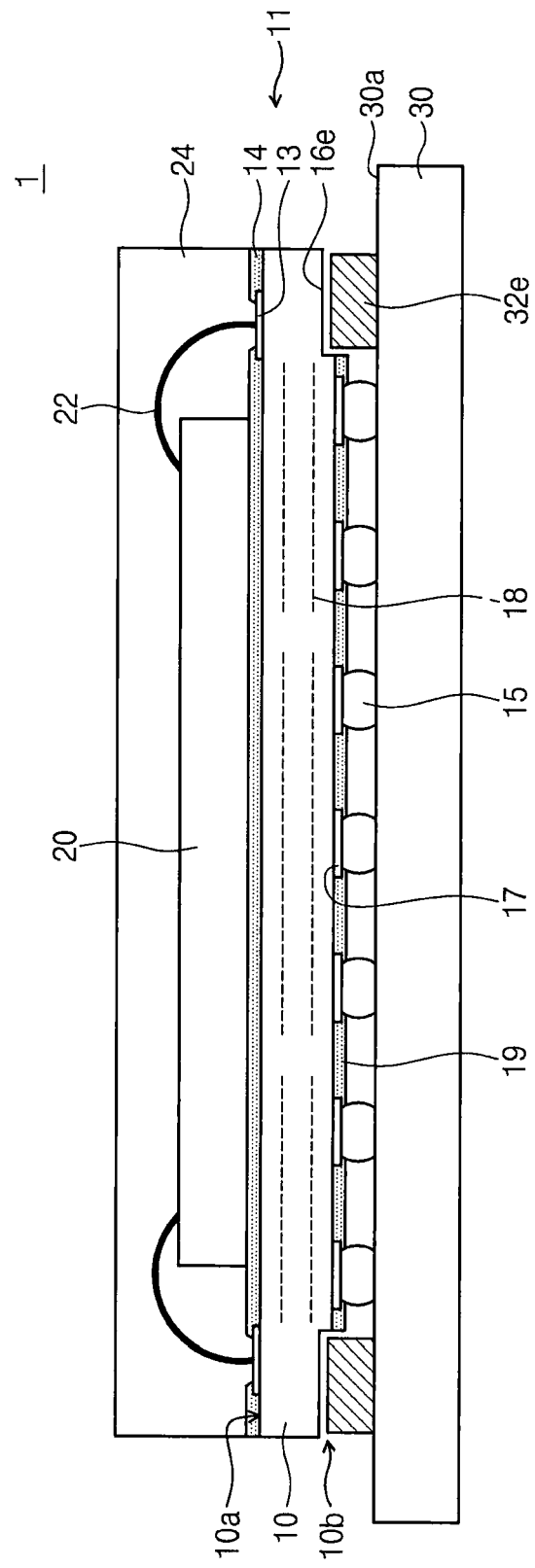
FIG. 1C is a cross-sectional view taken along the line IC-IC' of the FIG. 1B.

FIG. 1A is a perspective view illustrating a package substrate according to an example embodiment of the invention. FIG. 1B is a perspective view illustrating a semiconductor package including the package substrate of FIG. 1A. FIG. 1C is a cross-sectional view taken along the line IC-IC' of the FIG. 1B.

Referring to FIG. 1A, a package substrate 11 may include a main body 10 having an upper surface 10a and a lower surface 10b opposite to the upper surface 10a. A semiconductor chip may be mounted on the upper surface 10a and a plurality of external terminals 15 may be attached to the lower surface 10b. The external terminals 15 may include a solder ball. The external terminals 15 may be arranged in a matrix shape in a central region of the lower surface 10b and may be arranged in a sawtooth-like shape in an edge region of the lower surface 10b. In FIG. 1A, the upper surface 10a is illustrated so as to face downwardly and the lower surface 10b is illustrated so as to face upwardly for convenience.

The package substrate 11 may have at least one groove 16e on the lower surface 10b. The groove 16e may have an island shape recessed from the surface of the lower surface 10b. Alternatively, the groove 16e may have a long trench shape. Alternatively, the groove 16e may perforate through the main body 10. On the lower surface 10b of the package substrate 11, the groove 16e may be formed in a region where no external terminal occupies. For example, in the package substrate 11, a plurality of the grooves 16e may be formed in the edge region of the lower surface 10b. When the package substrate 11 is tetragonal, the plurality of grooves 16e may be formed in four edges or one edge of the lower surface 10b.

Referring to FIG. 1B, a semiconductor package 1 may have a structure in which the package substrate 11 mounted with at least one semiconductor chip 20 on the upper surface 10a is mounted on an upper surface 30a of a board 30. The package substrate 11 and the semiconductor chip 20 mounted on the package substrate 11 may form a chip scale package (CSP) module or a chip scale system-in-package (SIP) module, for example. The board 30 may be used as a main board of an electronic device such as a computer, a cellular phone, an MP3P, or a PMP. Alternatively, the board 30 may be used as a board of a memory module. The board 30 may include at least one mounting element 32e. For example, on the upper surface 30a of the board 30, a plurality of mounting elements 32e may be formed to be vertically aligned with the plurality of grooves 16e. The mounting elements 32e may include various kinds of passive elements such as resistors, capacitors, and inductors. In this example embodiment, the mounting elements 32e are not limited by the passive elements described above.

The mounting elements 32e may be inserted into the grooves 16e, respectively. Therefore, the regions where the mounting elements 32e are mounted on the upper surface 30a of the board 30 may overlap with the mounting regions of the package substrate 11. According to this example embodiment, since it is not necessary to provide the regions, where the mounting elements 32e are mounted, an effective mounting area may be increased without enlarging the size of the board 30. Since the effective mounting region of the board 30 is increased without enlarging the size thereof, it is possible to realize the semiconductor package 1 of a small form factor.

Referring to FIG. 1C, the package substrate 11 may be a printed circuit board PCB in which a circuit pattern 18 is formed inside the main body 10, an upper insulating layer 14 may be formed on the upper surface 10a, and a lower insulating layer 19 may be formed on the lower surface 10b. The main body 10 may have a structure in which an insulator and a conductor are sandwiched. The package substrate 11 may be a single-layer printed circuit board including a single-layer circuit pattern 18 or a multi-layer printed circuit board including a plurality of circuit patterns 18. The circuit pattern 18 may include a signal pattern for delivering signals, a power pattern for supplying power, and a ground pattern for providing ground between the semiconductor chip 20 and/or the board 30. The package substrate 11 may be connected electrically to the semiconductor chip 20 via bonding wires 22. The package substrate 11 may be connected electrically to the board 30 via the external terminals 15. As another example, the semiconductor chip 20 may be flip-chip bonded to the package substrate 11. In this case, the bonding wire 22 may be substituted by a flip chip bump. In the package substrate 11, an upper pad 13 serving as a land for connecting the bonding wire 22 is formed on the upper surface 10a, and a lower pad 17 serving as a land for connecting the external terminal 15 is formed on the lower surface 10b. A molding layer 24 molding the semiconductor chip 20 may be further formed on the upper surface 10a of the package substrate 11.

The groove 16e may be formed in a part of the lower surface 10b of the package substrate 11. For example, the groove 16e may be formed by removing the edge of the lower surface 10b or a portion of the edge of the lower surface 10b. The mounting element 32e mounted in the board 30 may be inserted into the groove 16e. A part of the whole of the mounting element 32e may be inserted into the groove 16e depending on the size of the groove 16e. According to this example embodiment of the invention, the groove 16e may be formed in the edge of the package substrate 11. On the upper surface 30a of the board 30, the mounting element 32e may be mounted at the position vertically aligned with the groove 16e of the package substrate 11. For example, the mounting element 32e may be mounted in the edge of the upper surface 30a of the board 30. Since it is not necessary to mount the mounting element 32e in the edge region of the board 30 on the upper surface 30a of the board 30, the size of the board 30 may not be enlarged.

The size and/or shape of the groove 16e may be modified freely. For example, the groove 16e may be designed depending on the size and/or of the mounting element 32e. As another example, the mounting element 32e appropriate for the size and/or shape of the groove 16e may be formed on the upper surface 30a of the board 30. Therefore, the grooves 16e may be formed in the package substrate 11 so as to be appropriately mounted on the board 30. Alternatively, the board 30 may be disposed with the mounting elements 32e so that the package substrate 11 is suitably mounted on the board 30. Since the circuit pattern 18 is formed in the package substrate 11, it is desirable that the groove 16e may be formed so as not to damage to the circuit pattern 18.

Figure 2A:
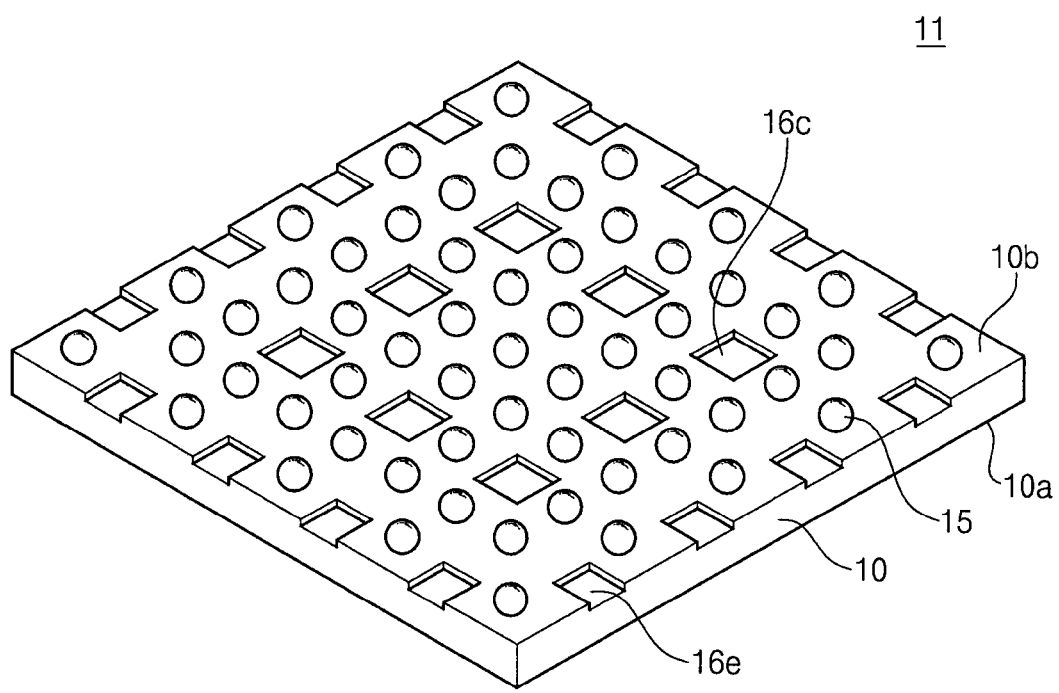
FIG. 2A is a perspective view illustrating a package substrate according to another example embodiment of the invention.
Figure 2B:
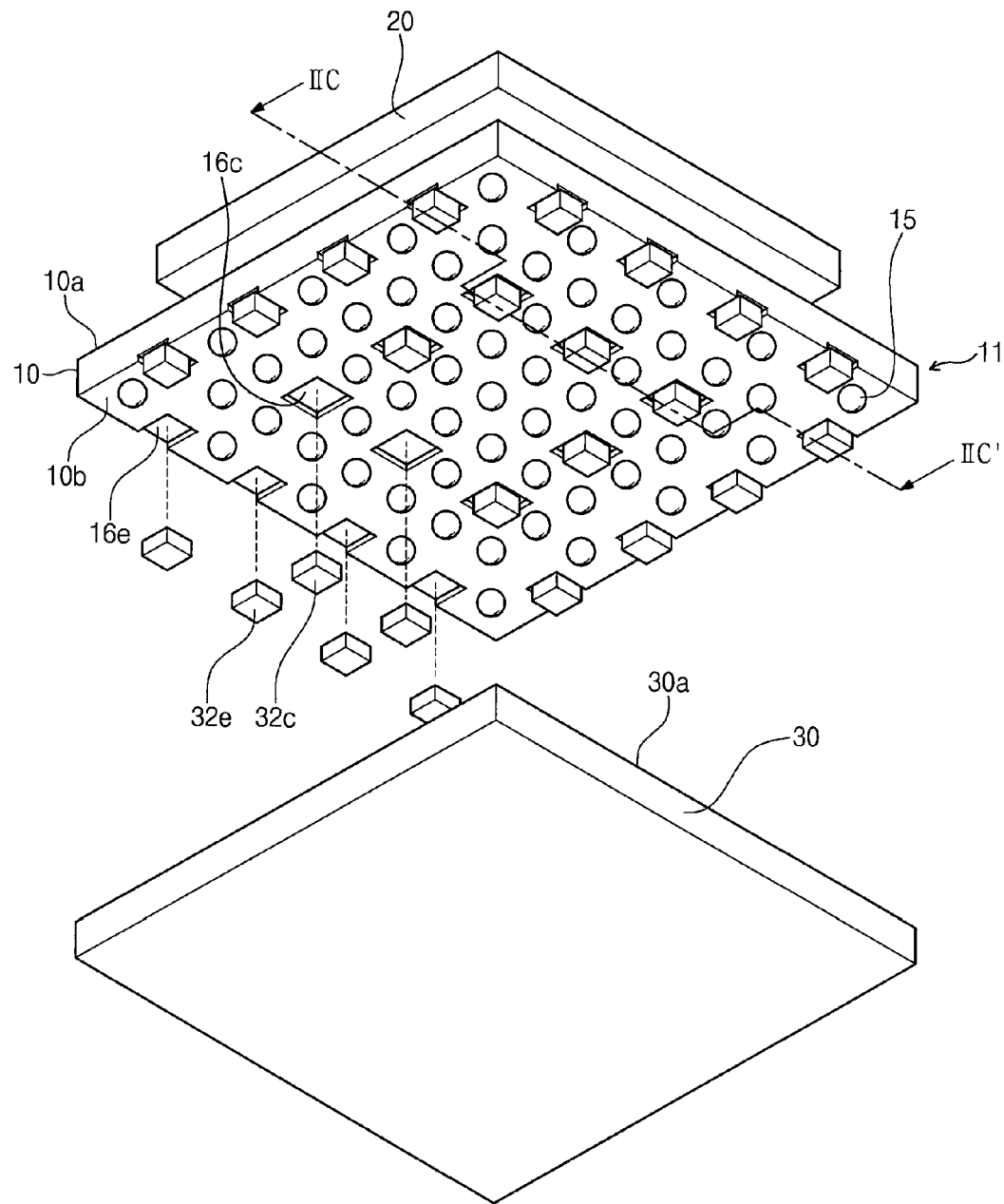
FIG. 2B is a perspective view illustrating the semiconductor package including the package substrate illustrated in FIG. 2A.
Figure 2C:
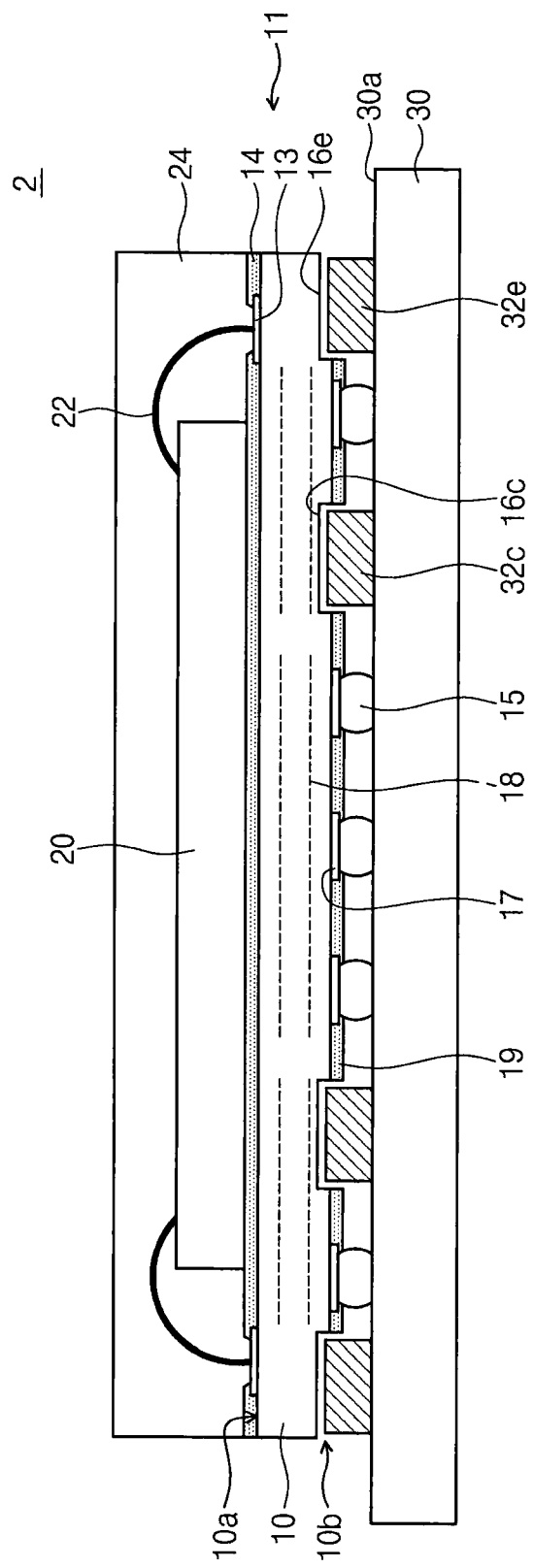
FIG. 2C is a cross-sectional view taken along the line IIC-IIC' of the FIG. 2B.

FIG. 2A is a perspective view illustrating a package substrate according to another example embodiment of the invention. FIG. 2B is a perspective view illustrating the semiconductor package including the package substrate 11 illustrated in FIG. 2A. FIG. 2C is a cross-sectional view taken along the line II-II' of the FIG. 2B. The repeated description with that in FIGS. 1A through 1C is omitted below.

Referring to FIG. 2A, the package substrate 11 may include the main body 10 having at least one first groove 16e formed in an edge region of the lower surface 10b and at least one second groove 16c formed in a central region of the lower surface 10b. For example, the package substrate 11 may include the plurality of first grooves 16e in four edges of the lower surface 10b and the plurality of second groove 16c at the center of the lower surface 10b. The arrangement of the first grooves 16e and the second grooves 16c may depend on the arrangement of the external terminals 15. For example, when the external terminals 15 are arranged in a sawtooth-like shape in the edge region of the lower surface 10b and are partially arranged in a matrix shape in the central region of the lower surface 10b, first openings 16e and second openings 16c may occupy regions where the external terminal 15 are not formed.

Referring to FIG. 2B, a semiconductor package 2 may have a structure in which the package substrate 11 including the first grooves 16e and the second grooves 16c in the lower surface 10b is mounted on the upper surface 30a of the board 30 and at least one semiconductor chip 20 is mounted on the upper surface 10a of the package substrate 11. The board 30 may include first mounting elements 32e respectively inserted into the first grooves 16e and second mounting elements 32c respectively inserted into the second grooves 16c. For example, the plurality of first mounting elements 32e may be disposed to be vertically aligned with the plurality of first grooves 16e in the edge region of the upper surface 30a of the board 30. In the central region of the upper surface 30a, the plurality of second mounting elements 32e may be disposed to be vertically aligned with the plurality of second grooves 16c. The first mounting elements 32e may include similar elements such as passive elements. The second mounting elements 32c may include elements similar to the first mounting elements 32e.

On the upper surface 30a of the board 30, the regions where the first mounting elements 32e and the second mounting elements 32c may overlap with the mounting regions of the package substrate 11. The sizes and/or shapes of the first grooves 16e and the second grooves 16c may be modified freely. For example, the sizes and/or shapes of the first grooves 16e and the second grooves 16c may be designed in accordance with the sizes and/or shapes of the first mounting elements 32e and the second mounting elements 32c. As another example, the first mounting elements 32e and the second mounting elements 32c may be provided so as to be appropriate for the sizes and/or shapes of the first grooves 16e and the second grooves 16c.

Referring to FIG. 2C, the first grooves 16e and the second grooves 16c are formed so as not to damage to the circuit pattern 18, since the package substrate 11 may have the circuit pattern 18 therein. However, the first grooves 16e and the second grooves 16c may damage the circuit pattern 18 within a range in which the electric characteristics or the performance of the semiconductor package 2 are not significantly affected. For example, when the circuit pattern 18 is a ground plane, one or several second grooves 16c may remove a part of the ground plane. Alternatively, when the circuit pattern 18 is a ground plane, one or several first grooves 16e may remove a part of the ground plane. Alternatively, when the circuit pattern 18 is a ground plane, one or several first and second grooves 16e and 16c may remove a part of the ground plane.

Figure 3A:
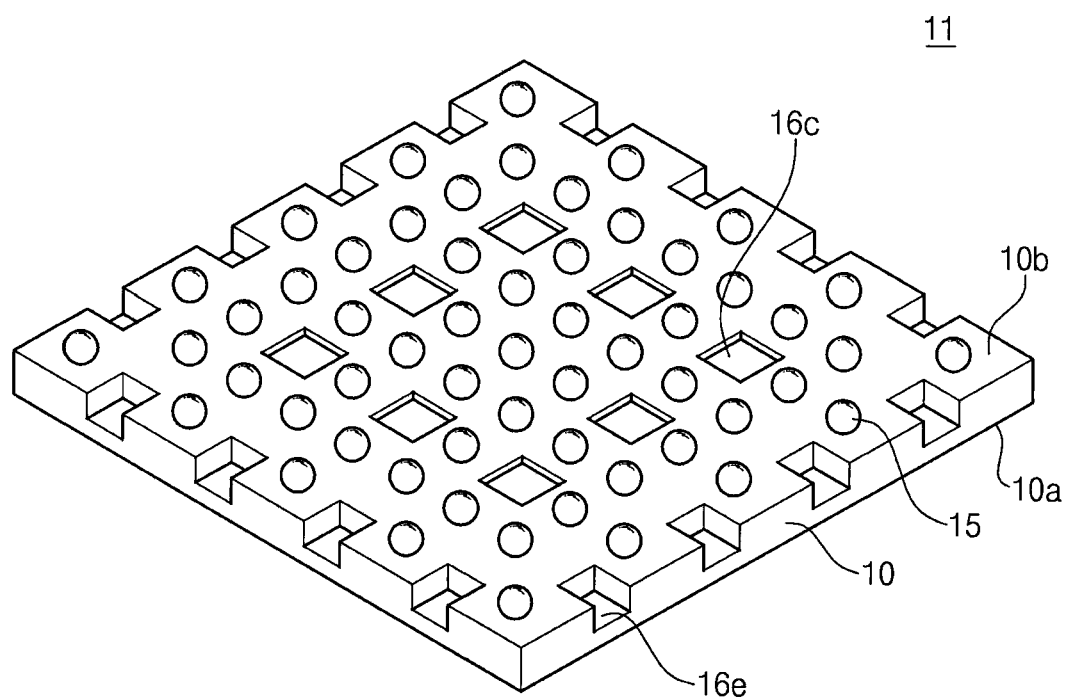
FIG. 3A is a perspective view illustrating the package substrate according to still another example embodiment of the invention.
Figure 3B:
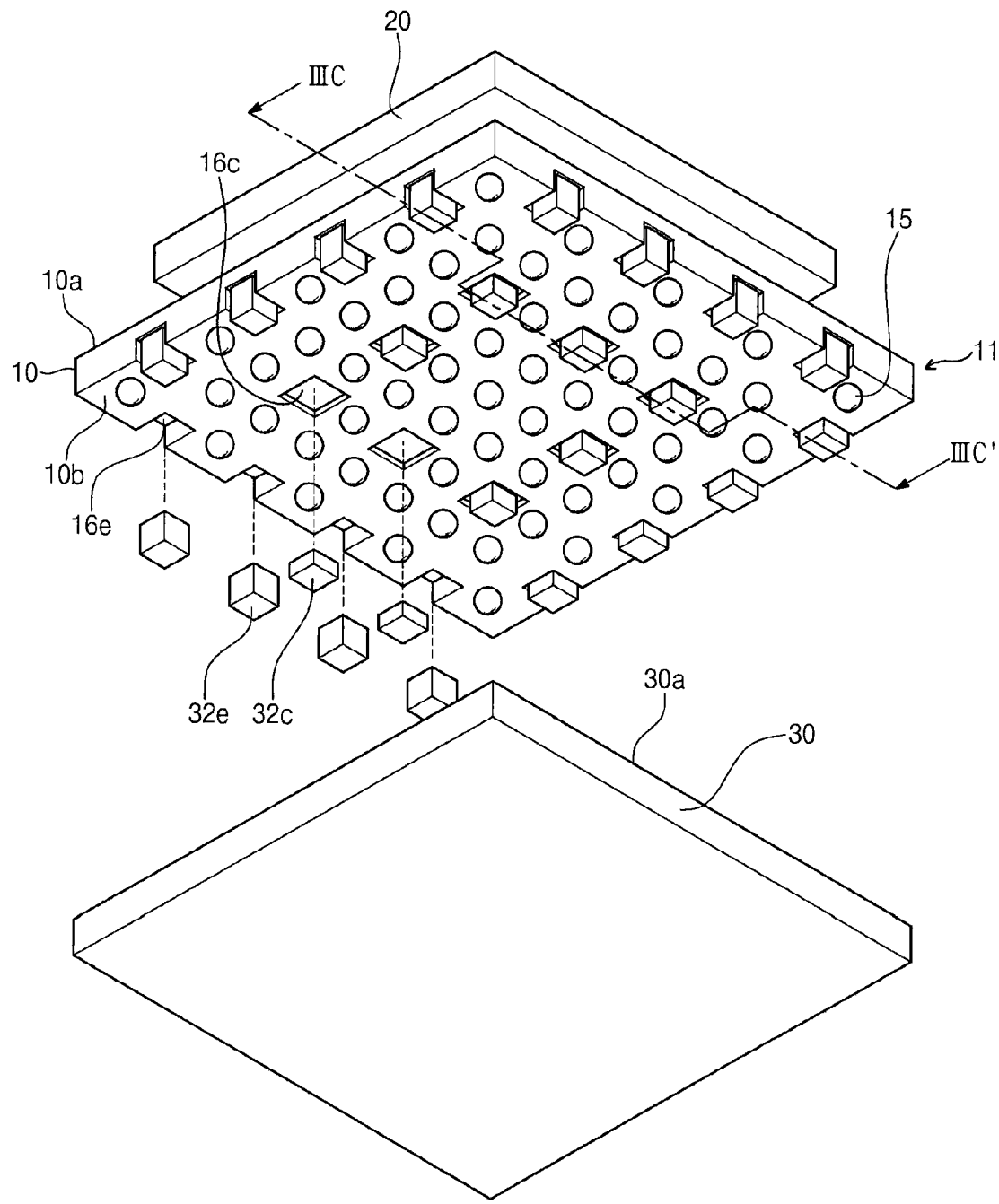
FIG. 3B is a perspective view illustrating the semiconductor package including the package substrate illustrated in FIG. 3A.
Figure 3C:
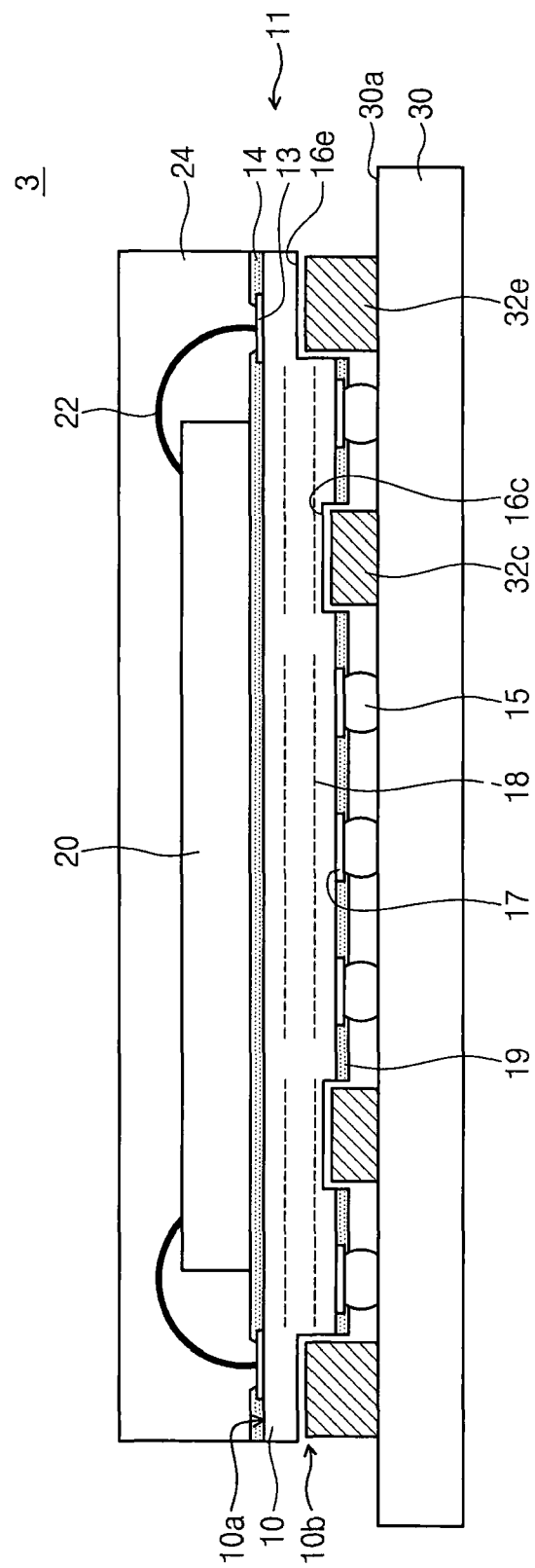
FIG. 3C is a cross-sectional view taken along the line IIIC-IIIC' of the FIG. 3B.

FIG. 3A is a perspective view illustrating the package substrate according to still another example embodiment of the invention. FIG. 3B is a perspective view illustrating the semiconductor package including the package substrate 11 illustrated in FIG. 3A. FIG. 3C is a cross-sectional view taken along the line IIIC-IIIC' of the FIG. 3B. The repeated description with that in FIGS. 2A through 2C is omitted below.

Referring to FIG. 3A, the package substrate 11 may include the main body 10 having at least one first groove 16e formed in an edge of the lower surface 10b and at least one second groove 16c formed in a central region of the lower surface 10b. For example, a plurality of first grooves 16e may be formed in four edges of the lower surface 10b and a plurality of second groove 16c may be formed at the center of the lower surface 10b. The design of the first groove 16e may be different from that of the second groove 16c. For example, the depth of the first groove 16e may be deeper than that of the second groove 16c, and vice versa. As another example, the shape of a first groove 16e may be different from a shape of a second groove 16c. For example, the first groove 16e may be circular whereas the shape of the second groove 16c may be polygonal.

Referring to FIG. 3B, a semiconductor package 3 may have a structure in which the package substrate 11 having the deeply formed first grooves 16e and the shallowly-formed second grooves 16c in the lower surface 10b is mounted on the upper surface 30a of the board 30 and at least one semiconductor chip 20 is mounted on the upper surface 10a of the package substrate 11. The board 30 may include first mounting elements 32e and second mounting elements 32c different from each other in the size. For example, the board 30 may include a plurality of first mounting elements 32e vertically aligned with the plurality of first grooves 16e in the edge region of the upper surface 30a and a plurality of second mounting elements 32c vertically aligned with the plurality of second grooves 16c in the central region of the upper surface 30a. The size of the first mounting elements 32e may be substantially larger or smaller than that of the second mounting elements 32c. On the upper surface 30a of the board 30, the regions where the first mounting elements 32e and the second mounting elements 32c are mounted may overlap with the mounting regions of the package substrate 11.

Referring to FIG. 3C, the first grooves 16e and the second grooves 16c are formed so as not to damage to the circuit pattern 18, since the package substrate 11 may have the circuit pattern 18 therein. For example, the circuit pattern 18 may not be formed in the edge of the package substrate 11 or may be formed at a low density. In this case, the first groove 16e may have a depth substantially deeper than that of the second groove 16c. Alternatively, the second groove 16c may have a depth substantially deeper than that of the first groove 16e. There is a possibility that a deeply formed second groove 16c may damage the circuit pattern 18 to a degree greater than a shallowly-formed second groove 16c. In this example embodiment, the second groove 16c may damage a part of the circuit pattern 18, such as a ground plane, within a range in which the electric characteristics or the performance of the semiconductor package 3 are not significantly affected.

FIGS. 4A through 4D are perspective views illustrating package substrates according to various example embodiments.

Figure 4A:
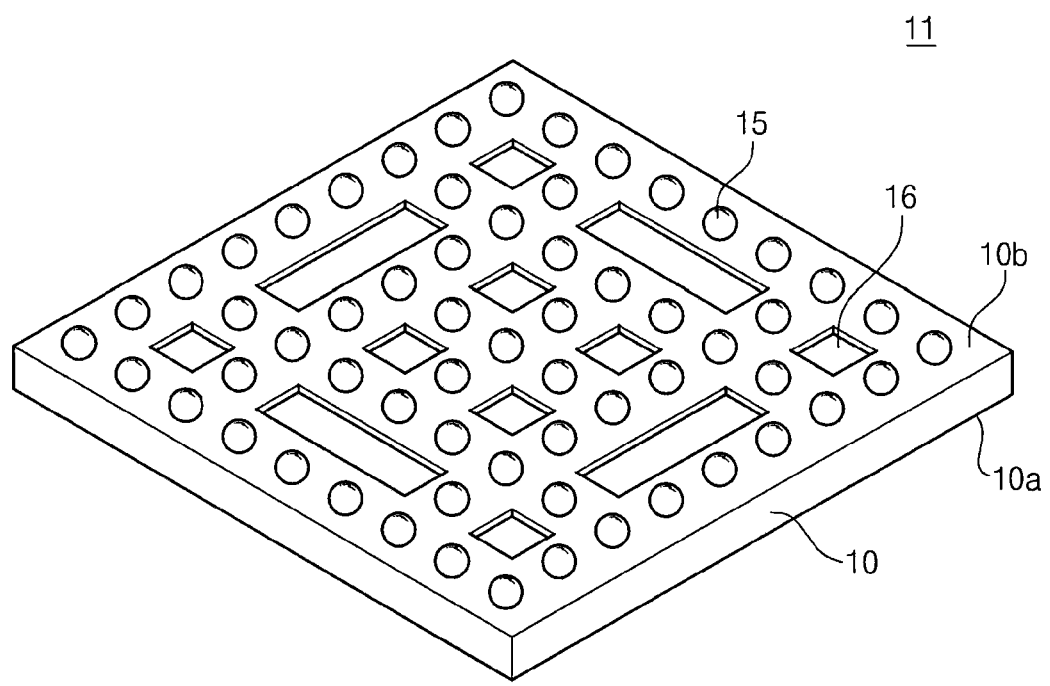
FIGS. 4A through 4D are perspective views illustrating a package substrate according to various example embodiments of the invention.

Referring to FIG. 4A, the package substrate 11 may include a plurality of external terminals 15 arranged in a ring shape on the lower surface 10b of the main body 10. The plurality of grooves 16 may be formed in regions of the lower surface 10b to which no external terminal 15 is attached. The size and depth of the plurality of grooves 16 may be modified freely or may be predetermined.

Figure 4B:
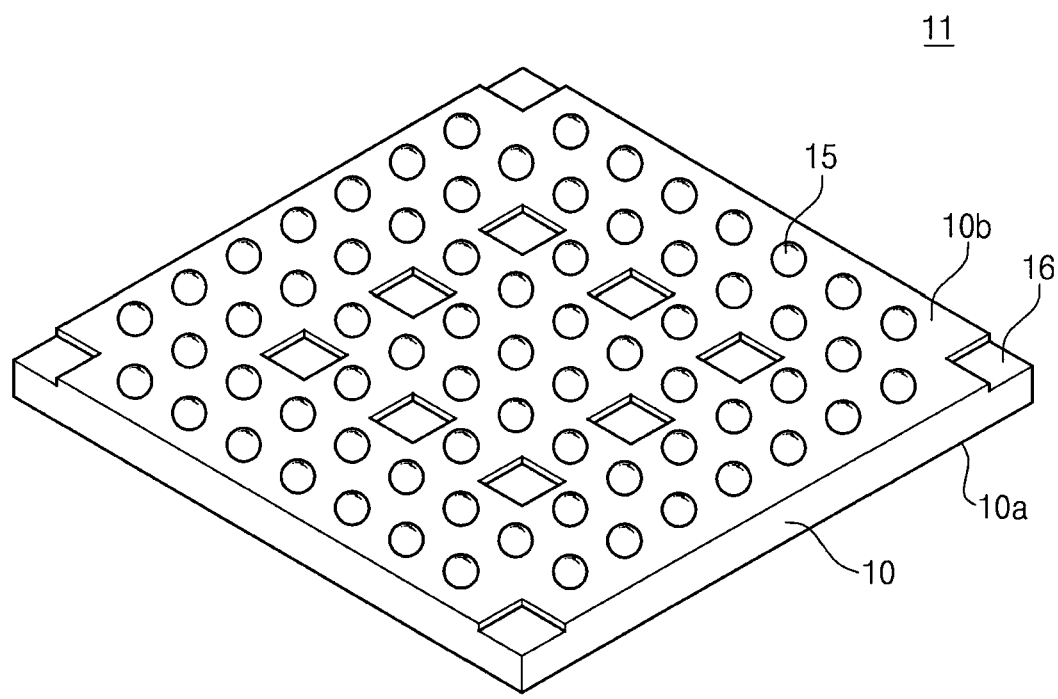

Referring to FIG. 4B, the package substrate 11 may include the plurality of external terminals 15 arranged in a ring shape on the lower surface 10b of the main body 10. No external terminal 15 may be formed in four corners of the lower surface 10b. In this case, the grooves 16 may further be formed in the four corners of the lower surface 10b.

Figure 4C:
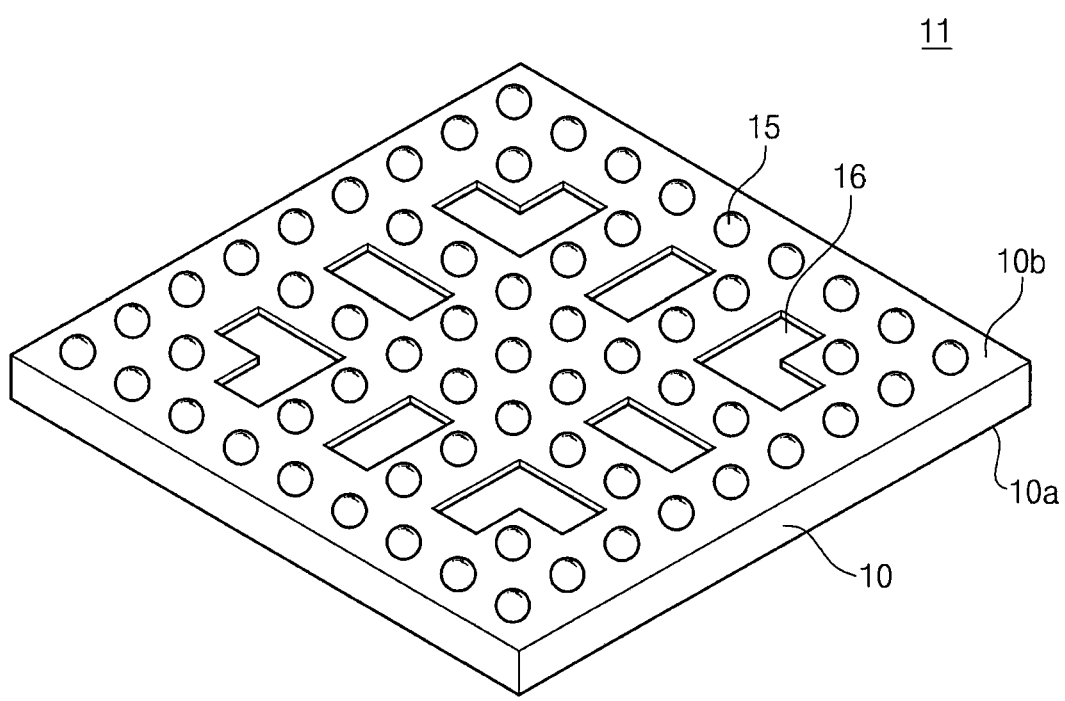

Referring to FIG. 4C, the package substrate 11 may include a plurality of external terminals 15 arranged in a spoke shape on the lower surface 10b of the main body 10. The grooves 16 may be formed in empty regions between the external terminals 15. In this example embodiment, the grooves may or may not have the same depths.

Figure 4D:
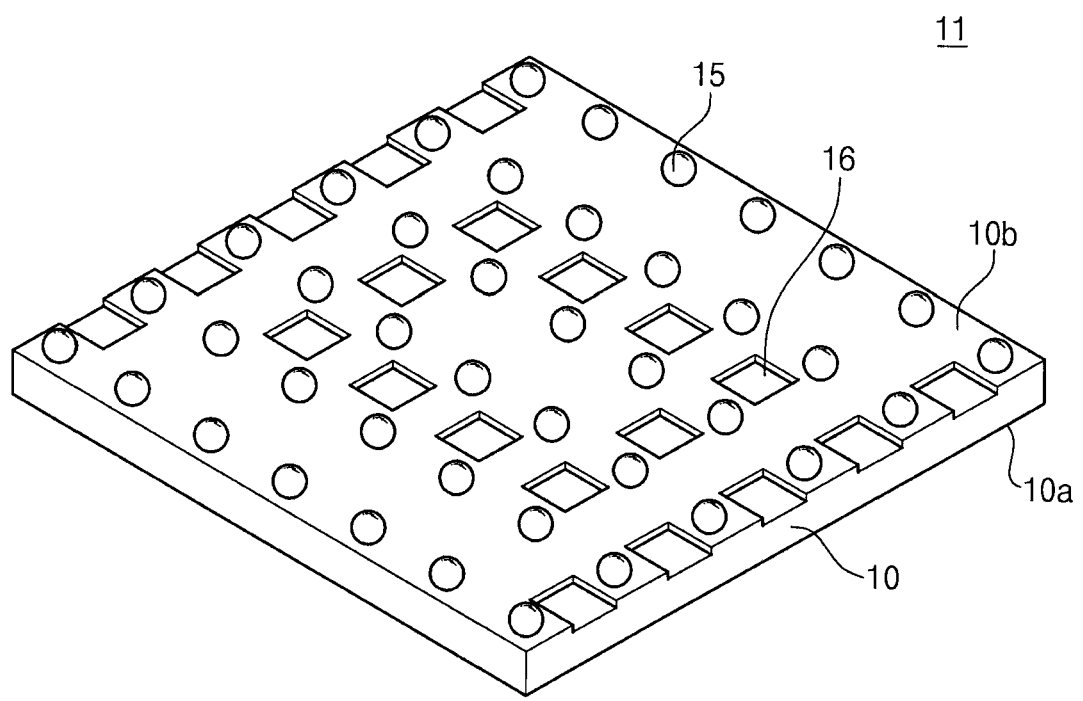

Referring to FIG. 4D, the package substrate 11 may include the plurality of external terminals 15 arranged in a full matrix shape on the lower surface 10b of the main body 10. On the lower surface 10b of the package substrate 11, regions where the grooves 16 are formed may be ensured in accordance with the pitch size between the external terminals 15. For example, the grooves 16 may be formed at the center or in the edges of the lower surface 10b.

Figure 5A:
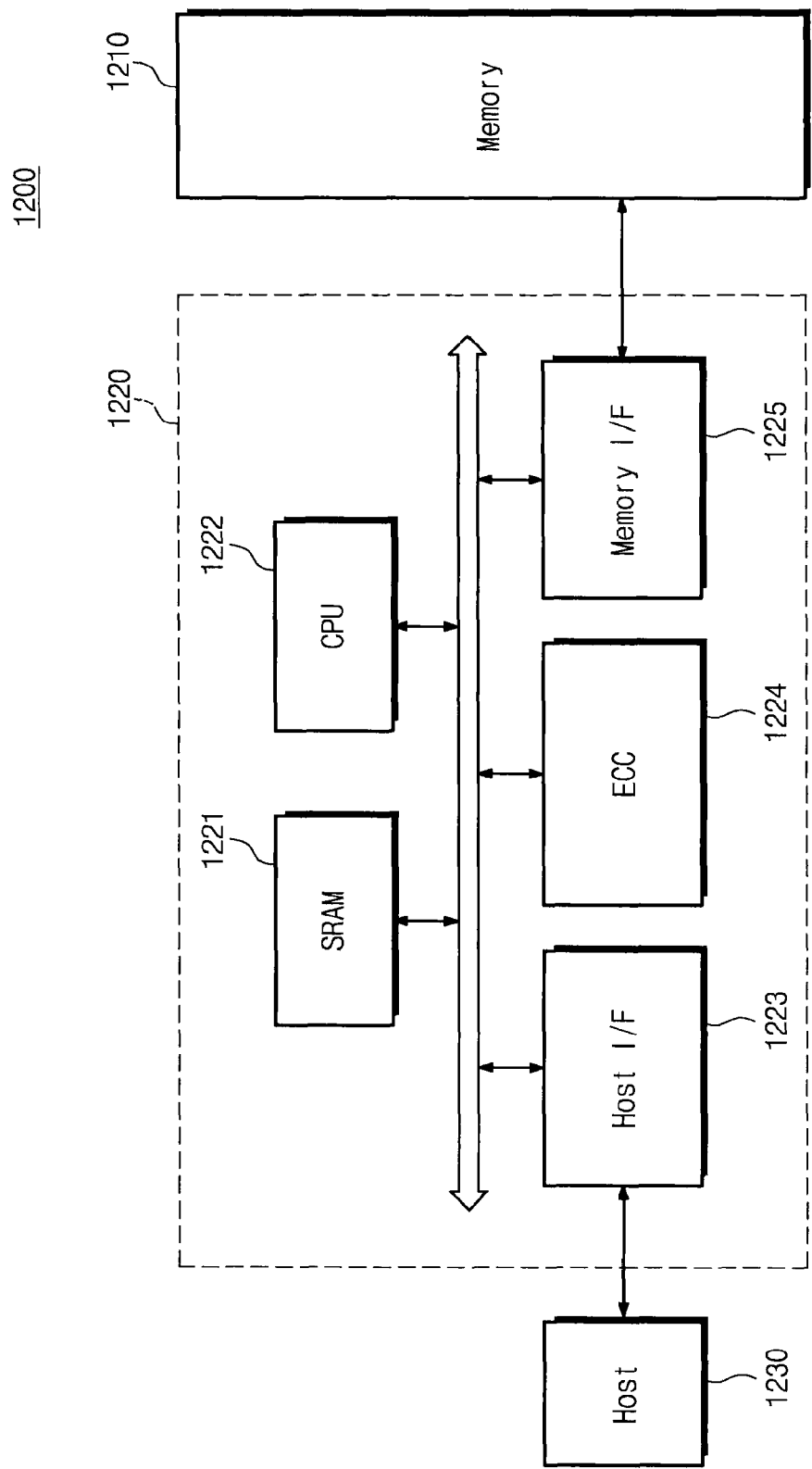
FIG. 5A is a block diagram illustrating a memory card having a semiconductor package according to an example embodiment of the invention.

FIG. 5A is a block diagram illustrating a memory card having the semiconductor package according to an example embodiment of the invention.

Referring to FIG. 5A, a semiconductor memory 1210 including the semiconductor package according to the various example embodiments of the invention is applicable to a memory card 1200. For example, the memory card 1200 may include a memory controller 1220 generally controlling data exchange between a host and the flash memory device 1210. An SRAM 1221 is used as a work memory of a processing unit 1222. A host interface 1223 has a data exchange protocol of a host connected to the memory card 1200. An error correction coding block 1224 detects and corrects errors contained in data read from the multi-bit flash memory device 1210. A memory interface 1225 interfaces the flash memory device 1210 according to the example embodiments. The processing unit 1222 generally controls data exchange of the memory controller 1220.

Figure 5B:
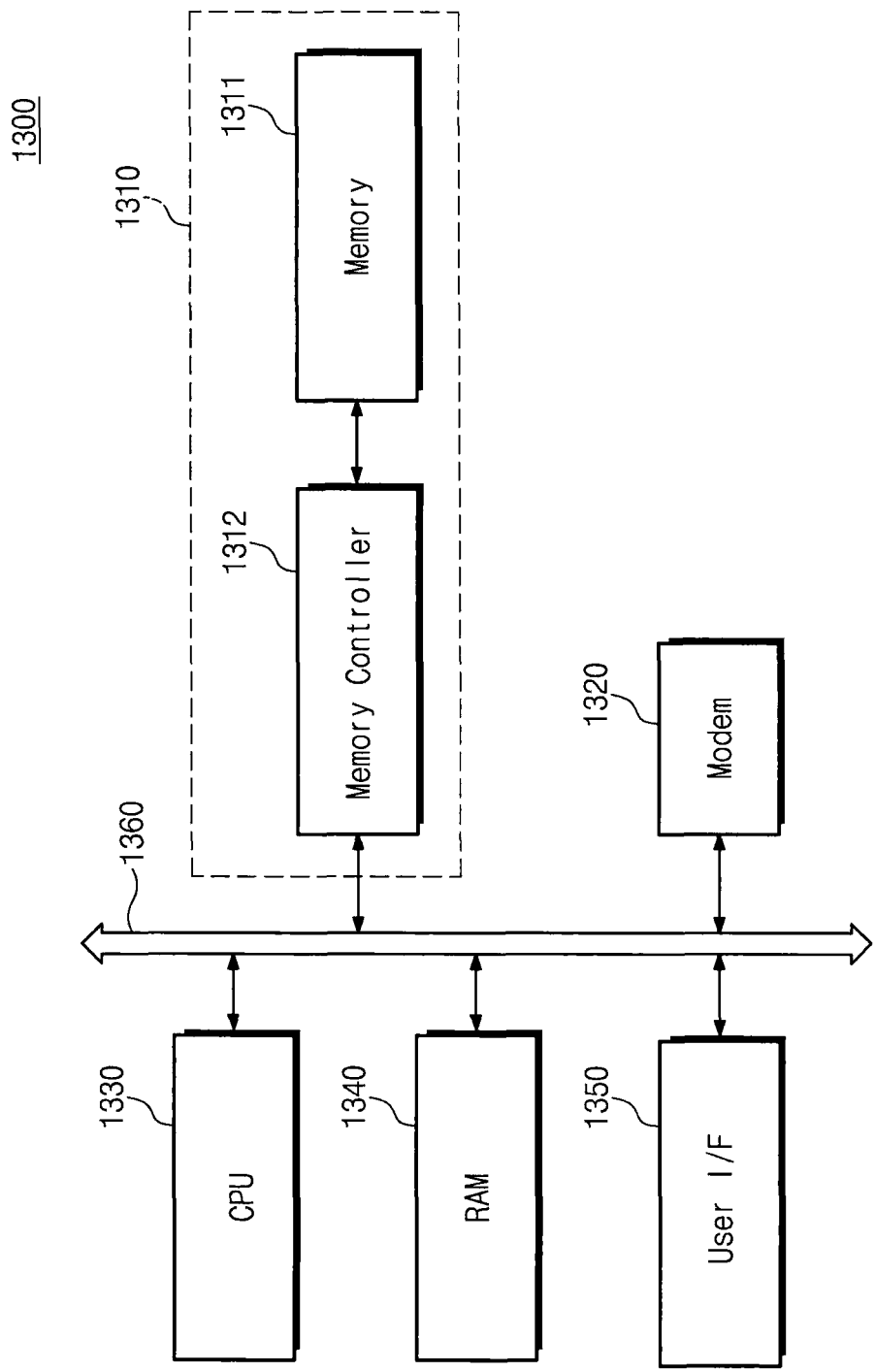
FIG. 5B is a block diagram illustrating an information processing system made by applying a semiconductor package according to an example embodiment of the invention.

FIG. 5B is a block diagram illustrating an information processing system made by applying the semiconductor packages according to an example embodiment of the invention.

Referring to FIG. 5B, an information processing system 1300 may include a memory system 1310 having the semiconductor package according to the example embodiments of the invention. The information processing system 1300 includes a mobile device or a computer. For example, the information processing system 1300 may include a modem 1320, a central processing unit 1330, a RAM 1340, and a user interface 1350 electrically connected to the flash memory system 1310 via a system bus 1360. The flash memory 1310 may include a memory 1311 and a memory controller 1312 and have substantially the same configuration as that of the memory card 1200 in FIG. 5A. The flash memory system 1310 stores data processed by the central processing unit 1330 or data input from the outside. The information process system 1300 may be provided as a memory card, a semiconductor device disk, a camera image sensor, and other application chipsets. For example, the memory system 1310 may be realized as a solid state drive (SSD). In this case, the information processing system 1300 may stably store large data in the flash memory system 1310.

Semiconductor packages according to the example embodiments of the invention may be realized in various types of packages. For example, the semiconductor packages according to the various example embodiments of the invention may be packaged in various ways such as package on package, ball grid array, chip scale packages, plastic leaded chip carrier, plastic dual in-line package, multi chip package, wafer level package or wafer level fabricated package, wafer level stack package, die on waffle package, die in wafer form, chip on board, ceramic dual in-line package, plastic metric quad flat pack, thin quad flat pack, small outline package, shrink small outline package, thin small outline package, thin quad flat package, or system in package.

According to the example embodiments of the invention, the grooves are formed in the package substrate without enlarging the size of the board, thereby realizing the advantage of maximizing the effective mounting area. Moreover, by increasing the effective mounting area, it is possible to reduce the form factor of the semiconductor package.

Figure 6:
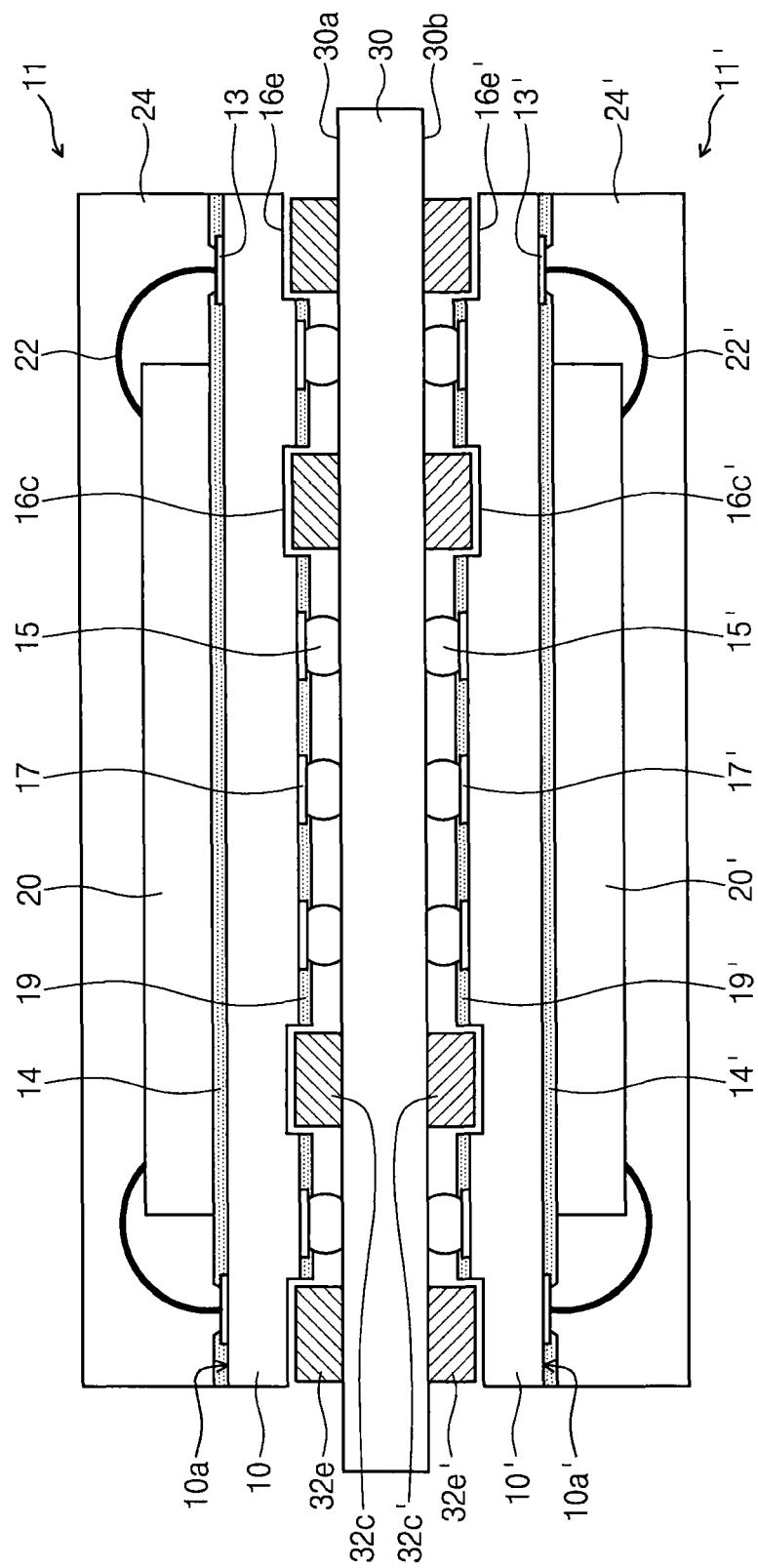
FIG. 6 is a semiconductor package including two package substrates according to example embodiments of the invention.

Although the aforementioned example embodiments illustrate a semiconductor package having a single package substrate mounted on a board, the invention is not limited thereto. For example, FIG. 6 illustrates an example embodiment having two package substrates 11 and 11' mounted to different sides of a board 30. In this example, the first package substrate 11 may be identical to the package substrate 11 of FIG. 2C and the second semiconductor package 11' may likewise be identical to the package substrate 11 of FIG. 2C, except that 11' is mounted on a lower surface 30b of the board 30 which may include mounting elements 32e' and 32c'. Like the mounting elements 32e and 32c of FIG. 2C, the mounting elements 32e' and 32c' may include passive elements such as resistors, capacitors, and inductors. In this example embodiment, each of the elements 10', 10a', 10b', 13', 14', 15', 16c', 16e', 17', 18', 19', 20', 22', 24', 32c', and 32e' illustrated in FIG. 6 correspond to elements 10, 10a, 10b, 13, 14, 15, 16c, 16e, 17, 18, 19, 20, 22, 24, 32c, and 32e of FIG. 2C, accordingly, a description thereof is omitted for the sake of brevity.

In FIG. 6, the two semiconductor packages 11 and 11' may be identical, however, the invention is not limited thereto. For example, rather than having a configuration identical to the semiconductor package 11 of FIG. 2C, the second semiconductor package 11' could have the configuration of the semiconductor package 11 of FIG. 1C or 3C or could include a semiconductor package which uses one of the main bodies of FIGS. 4A-4D.

The foregoing detailed description disclosed herein is not considered to be limiting the invention, but are intended to cover various combinations, modifications, and other example embodiments within the scope of the invention without departing the gist of the invention. The appended claims should be construed as including other embodiments.

What is claimed is:

1. A package substrate comprising;
   a main body having an upper surface and a lower surface opposite to the upper surface;
   a plurality of external terminals on the lower surface; and
   at least one groove in a region of the lower surface to which the plurality of external terminals is not attached, wherein
      the at least one groove is recessed toward the upper surface from a face of the lower surface, and
      the at least one groove includes a plurality of first grooves and a plurality of second grooves on the lower surface, the plurality of first grooves spaced along an edge of the main body and the plurality of second grooves in a central region of the main body forming a rectangular pattern, the plurality of first grooves are recessed more than the plurality of second grooves, and neither of the plurality of first grooves and the plurality of second grooves completely penetrates the main body.

2. The package substrate of claim 1, wherein the lower surface of the main body is configured to face a board to be coupled thereto and the upper surface of the main body is configured to face a semiconductor chip to be mounted thereon.

3. The package substrate of claim 1,
wherein the central region is a region being opposite a semiconductor chip, the semiconductor chip disposed on the upper surface of the main body of the package substrate.

4. A package substrate comprising:
a main body having an upper surface and a lower surface opposite to the upper surface;
a plurality of external terminals on the lower surface; and
at least one groove in a region of the lower surface to which the plurality of external terminals is not attached, wherein
the at least one groove of the package substrate is configured to be coupled to a board,
the at least one groove of the package substrate is configured to receive at least one mounting element, the at least one mounting element being on the board, and
the at least one mounting element includes at least one passive element, the at least one passive elements being at least one of a resistor, a capacitor, and an inductor.

\* \* \* \* \*